(12) United States Patent
Lim et al.

(10) Patent No.: US 12,250,800 B2
(45) Date of Patent: Mar. 11, 2025

(54) RADIATION SHIELD WITH ZIPPER

(71) Applicant: Intel Corporation, Santa Clara, CA (US)

(72) Inventors: Yew San Lim, Penang (MY); Jeff Ku, Taipei (TW); Boon Ping Koh, Penang (MY); Min Suet Lim, Penang (MY); Tin Poay Chuah, Penang (MY)

(73) Assignee: Intel Corporation, Santa Clara, CA (US)

( * ) Notice: Subject to any disclaimer, the term of this patent is extended or adjusted under 35 U.S.C. 154(b) by 645 days.

(21) Appl. No.: 17/482,244

(22) Filed: Sep. 22, 2021

(65) Prior Publication Data

US 2022/0015272 A1  Jan. 13, 2022

(51) Int. Cl.
*H05K 9/00* (2006.01)
*H05K 1/02* (2006.01)
*H05K 7/20* (2006.01)

(52) U.S. Cl.
CPC ......... *H05K 9/0024* (2013.01); *H05K 1/0203* (2013.01); *H05K 1/0218* (2013.01); *H05K 7/20336* (2013.01); *H05K 7/20509* (2013.01)

(58) Field of Classification Search
CPC .................. H05K 9/0024; H05K 7/20336
See application file for complete search history.

(56) References Cited

U.S. PATENT DOCUMENTS

| | | | | |
|---|---|---|---|---|
| 2001/0046119 | A1* | 11/2001 | Hamano | H05K 9/0022 361/679.54 |
| 2006/0126309 | A1* | 6/2006 | Bolle | H05K 7/20436 361/719 |
| 2011/0176279 | A1* | 7/2011 | Zhao | H01L 23/552 361/720 |
| 2020/0027844 | A1* | 1/2020 | Han | H01L 23/3675 |
| 2021/0104995 | A1* | 4/2021 | Liu | H01P 1/2005 |
| 2021/0120665 | A1* | 4/2021 | Lee | H05K 9/0032 |

* cited by examiner

*Primary Examiner* — Hung V Ngo
(74) *Attorney, Agent, or Firm* — Banner & Witcoff Ltd.

(57) ABSTRACT

Particular embodiments described herein provide for an electronic device that can be configured to include a radiation shield that includes a zipper. The radiation shield can include a wall that extends from a support structure of the electronic device, a first portion that is coupled to a cold plate over a radiation source, a second portion that is coupled to the wall, and a zipper that can zip the first portion to the second portion together and can unzip to separate the first portion from the second portion.

20 Claims, 7 Drawing Sheets

RADIATION SHIELD WITH ZIPPER

TECHNICAL FIELD

This disclosure relates in general to the field of computing, and more particularly, to a radiation shield with a zipper.

BACKGROUND

Emerging trends in systems place increasing performance demands on the system. One way to attempt to improve performance and function is to increase the density of the devices and systems and pack more computing elements into the devices and systems. The increasing performance demands can create a relatively crowded system as more and more components are located in close proximity to each and can cause radiating noise level increases in the system. More specifically, the increase in computing elements often causes elevated noise levels in systems. Electromagnetic interference (EMI) and radio-frequency interference (RFI) affect almost every electronic device, especially mobile compute devices. In addition, some electrical components are both a source of electromagnetic and radio-frequency radiation and are susceptible to EMI/RFI from adjacent sources. The radiating noise level can cause a reduction in device performance, a reduction in the lifetime of a device, and/or delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
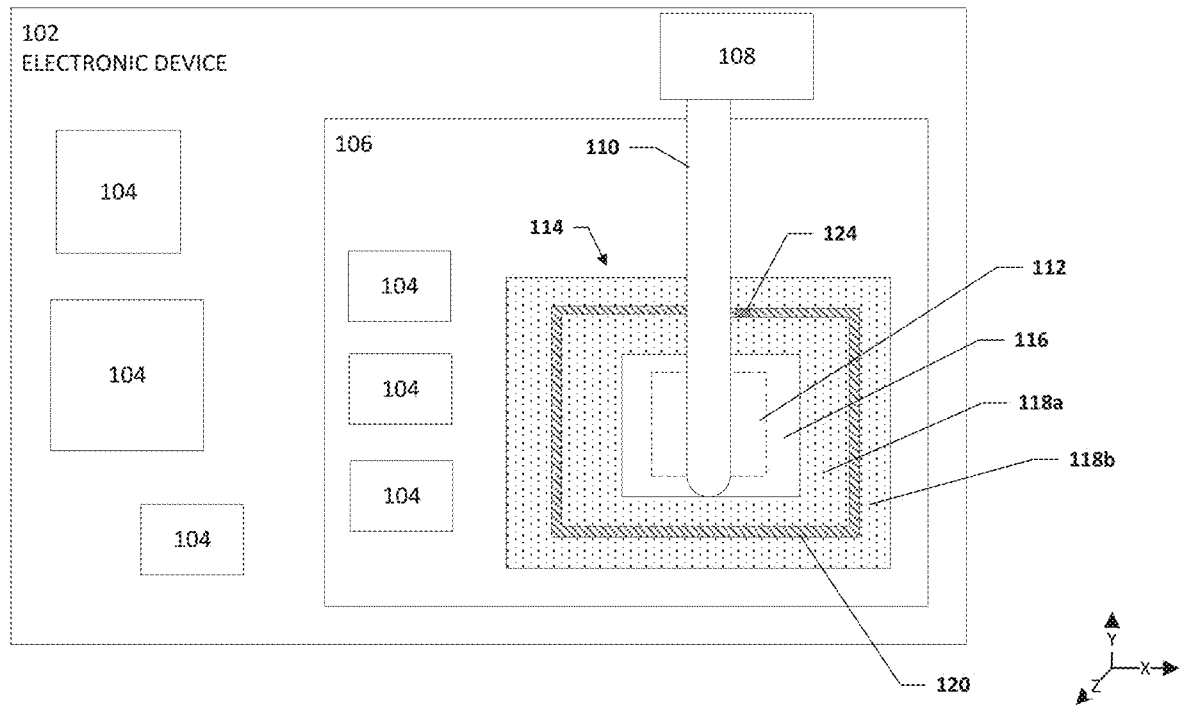
FIG. 1 is a simplified block diagram of a system to enable a radiation shield with a zipper, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a radiation shield with a zipper. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "directly on" a second layer is in direct contact with that second layer. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example. The term "about" indicates a tolerance of twenty percent (20%). For example, about one (1) millimeter (mm) would include one (1) mm and ±0.2 mm from one (1) mm. Similarly, terms indicating orientation of various elements, for example, "coplanar," "perpendicular," "orthogonal," "parallel," or any other angle between the elements generally refer to being within +/−5-20% of a target value based on the context of a particular value as described herein or as known in the art.

FIG. 1 is a simplified block diagram of an electronic device configured with a radiation shield with a zipper, in accordance with an embodiment of the present disclosure. In an example, an electronic device 102 can include a radiation shield with a zipper. More specifically, as illustrated in FIG. 1, the electronic device 102 includes one or more electronics 104, a support structure 106, a heatsink 108, and a heat pipe 110. The support structure 106 can include at least one of the one or more electronics 104, one or more radiation sources 112, a radiation shield 114, and a cold plate 116. Each of the one or more electronics 104 can be a device or group of devices available to assist in the operation or function of the electronic device 102. The heatsink 108 may be an active heat sink or a passive heat sink. In a specific example, the heatsink 108 includes a fin stack and a fan.

The support structure 106 can be a substrate and more particularly, a printed circuit board (PCB). The one or more radiation sources 112 can be on or over the support structure 106. The one or more radiation source 112 can be a heat source and the cold plate 116 can be over the one or more radiation sources 112 to help transfer heat away from the one or more radiation sources 112. The cold plate 116 can be comprised of copper, aluminum, graphite, graphene, an alloy such as nickel copper, or some material that is electrically conductive and can help transfer heat from the one or more radiation sources 112 to the heat pipe 110. The heat pipe 110 can help transfer heat from the one or more radiation sources 112 (a heat source) and/or the cold plate 116 to the heatsink 108. The heat pipe 110 can be a heat pipe, oscillating heat pipe, vapor chamber, or some other similar type of mechanism that can transfer heat from the one or more radiation sources 112 and/or the cold plate 116 to the heatsink 108.

The radiation shield 114 can be over the one or more radiation sources 112 and include a zipper. More specifically, as illustrated in FIG. 1, the radiation shield 114 includes a first portion material 118a, a second portion material 118b, and a zipper 120. The zipper 120 can include a zipper pull tab 124. The first portion material 118a can be coupled to the cold plate 116 and the second portion material 118b can be coupled to the walls (not shown) of the radiation shield 114. The zipper 120 can be used to secure or "zip" the first portion material 118a and the second portion material 118b together to create a lid of the radiation shield 114. The first portion material 118a and the second portion material 118b are an electrically conductive material and grounded through the walls of the radiation shield 114 (if the walls of the radiation shield 114 are coupled to the ground plane of the support structure 106), grounded through the heat pipe 110 or the cold plate 116, or grounded through some other means. In some examples, the first portion material 118a and the second portion material 118b can be flexible. The first portion material 118a and the second portion material 118b can be the same material and be comprised of a conductive fabric or some other type of material that is conductive and will allow the zipper 120 to be used to secure or "zip" the first portion material 118a and the second portion material 118b together to create the lid of the radiation shield 114. The zipper 120 is also conductive or at least partially conductive such that the zipper 120 does not create an insulating barrier or gap between the first portion material 118a and the second portion material 118b.

In some examples, the first portion material 118a and the second portion material 118b can be flexible. Typically, a load is applied to the cold plate 116 to help with the heat transfer from the one or more radiation sources 112 (a heat source) to the cold plate 116. The compression force of the cold plate 116 can interfere with the structural integrity of a stiff radiation shield and the flexibility of the first portion material 118a and the second portion material 118b can help the radiation shield maintain structural integrity. In addition, when the zipper 120 secures or "zips" the first portion material 118a and the second portion material 118b together to create the lid of the radiation shield 114, the zipper creates/uses a horizontal force that is perpendicular to the vertical load on the cold plate 116 and does not interfere (or substantially interfere) with the load on the one or more radiation sources 112 from the cold plate 116 (e.g., does not create or directly cause an uneven load on the one or more radiation sources 112 from the cold plate 116).

The radiation shield 114 can help contain or mitigate the radiation from the one or more radiation sources 112 from extending past the radiation shield 114 or at least partially contain or mitigate the radiation from the one or more radiation sources 112 from extending past the radiation shield 114. The radiation may be electromagnetic radiation, internal and external Wi-Fi and cellular radio-frequency radiation, high speed input/output (I/O) trace/connector digital noise radiation, switching voltage regulator radiation, or some other type of radiation that can have an undesirable effect on one or more components of an electronic device. For example, electromagnetic interference (EMI) and radio-frequency interference (RFI) affect almost every electronic device, especially mobile compute devices. System on a chip (SoC) packages are both a source of electromagnetic radiation and radio-frequency radiation and are susceptible to EMI/RFI from adjacent sources. For example, when a smartphone is placed on or near a keyboard of a laptop, performance of the laptop is often impacted (e.g., laptop screen flicker, CPU hang, reboot of the system, etc.). The term "radiation" includes electromagnetic radiation, radio-frequency radiation, and other similar radiation that can cause an undesirable effect on one or more components of an electronic device.

It is to be understood that other embodiments may be utilized and structural changes may be made without departing from the scope of the present disclosure. Substantial flexibility is provided in that any suitable arrangements and configuration may be provided without departing from the teachings of the present disclosure.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function.

One way to increase performance and function is to increase the density of the devices and systems and pack more computing elements into the devices and systems. However, the increase in computing elements causes an increase in the EMI and RFI. EMI and RFI affect almost every electronic device, especially mobile compute devices. In addition, SoC packages are both a source of electromagnetic and radio-frequency radiation and are susceptible to EMI/RFI from adjacent sources.

Die and package radiation have been identified as RFI risk factors. In addition, radio frequency signals from internal radios and external smartphones in proximity to personal computers have interfered with the SoCs and caused basic functionality issues, including display flickering and system hang/reboot. Some SoC designs introduce disaggregation and multichip package (MCP) using an embedded multi-die interconnect bridge (EMIB) which can increase both RFI and immunity risk. Also, scalable package-level shielding techniques (simultaneously shielding both the package and the dies) are required for some Internet of Things (IoT) devices, data centers, SoCs, and seven (7)/ten (10) nm disaggregated systems.

In some systems, the package layer-count increases to provide a package surface shielding with a ground layer at the expense of package cost and system Z height. However, the package surface shielding can be insufficient because of multiple-die radiation. In addition, package surface shielding with an additional ground layer reduces radio frequency noise radiation/coupling but at the expense of package cost and Z height increases. In other systems, a conductive coating may be used. However, a conductive coating, such as metal sputtering, is considered to be prohibitively-expensive and is an uncertified manufacturing process for SoC applications and high-volume manufacturing.

In some systems, an on-board shield may be used to implement a Faraday cage with a motherboard and PCB ground contacts. While on-board shielding is relatively common, it requires good ground stitching between the Faraday cage and motherboard and PCB ground contacts. In general, about 2.5 to about five (5) mm ground stitching space (about $\lambda/20$ to about $\lambda/10$) is required to provide good shielding effectiveness up to about five (5) to about six (6) GHz WiFi channels. This requirement is almost impossible to meet for Type-3 PCBs and for compact size shielding solutions, especially for SoCs with high-density interconnects. Increasing the size of shielding for its placement around less dense PCB areas can cause mechanical warp, height increase, and thermal contact issues. The shielding effectiveness significantly relies on PCB designs and technologies (e.g., Type-3 PCB vs. Type-4 PCB) and the on-board shielding solutions are applicable only for Type-4 PCBs, which are higher in cost than Type-3 and are used only for a small number of premium PCs. High volume PCs are designed with Type-3 PCBs.

With some current radiation shields, a relatively high cost is typically associated with most two-piece metal radiation shields (lid and frame) and surface mount technology issues can arise due to frame warpage. In addition, with some radiation shields, it can be difficult to remove the radiation shield and/or to gain access to components that are under the radiation shield. What is needed is a radiation shield that includes a zipper that can be used to unzip or open the radiation shield to allow access to the components under the radiation shield. Also, it would be beneficial if the radiation shield were flexible to accommodate warpage.

A radiation shield, as outlined in FIG. 1, can resolve these issues (and others). In an example, a radiation shield (e.g., the radiation shield 114) can include a first portion material (e.g., the first portion material 118a) coupled to a cold plate (e.g., the cold plate 116) over a radiation source (e.g., the radiation source 112), a second portion material (e.g., the second portion material 118b), and a zipper (e.g., the zipper 120). The zipper can be used to secure or "zip" the first portion material and the second portion material together to create the lid of the radiation shield.

The radiation shield can help to provide a shield against the effects of electromagnetic waves and can provide attenuations of eighty (80) dB for a lower frequency of 2.45 GHz and at least thirty (30) dB attenuation for a higher frequency of 6.5 GHz. Also, the first portion material and the second portion material can be flexible to help absorb warpage of the radiation shield and can allow for a larger tolerance of shield frame warpage as compared to some current radiation shields. The zipper can be used to unzip or separate the first portion material and the second portion material to allow serviceability of the radiation shield (e.g., for shield replacement, lid exchange, etc.) to be relatively easy and fast as compared to some current radiation shields where the radiation shield is secured to a PCB using solder.

Figure 2A:
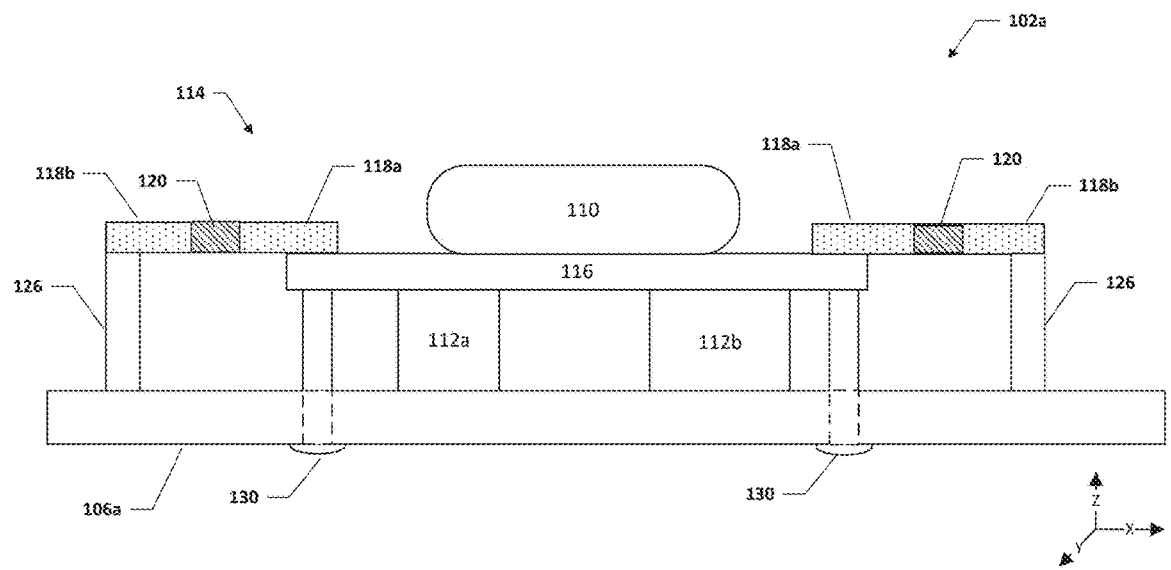
FIG. 2A is a simplified block diagram cut away side view of a portion of a system to enable a radiation shield with a zipper, in accordance with an embodiment of the present disclosure.

Turning to FIG. 2A, FIG. 2A is a simplified block diagram of a side cut away view of a portion of an electronic device 102a, in accordance with an embodiment of the present disclosure. In an example, the electronic device 102a can include the support structure 106a, a first radiation source 112a, a second radiation source 112b, the radiation shield 114, the cold plate 116, and the heat pipe 110. The radiation shield 114 can include the first portion material 118a, the second portion material 118b, the zipper 120, and radiation shield walls 126. The cold plate 116 can be secured to the support structure 106a using one or more cold plate attachment mechanisms 130. The radiation shield walls 126 can extend from the support structure 106a.

As illustrated in FIG. 2A, the first portion material 118a can be coupled to a side of the cold plate 116 that is in thermal contact with the heat pipe 110. The first portion material 118a can be coupled to the cold plate 116 using adhesive, tape, fastener, (e.g., a bolt, rivet, screw, etc.), or some other means of securing the first portion material 118a to the cold plate 116 to help create the radiation shield 114. The second portion material 118b can be coupled to the radiation shield walls 126 using adhesive, tape, fastener, (e.g., a bolt, rivet, screw, etc.), or some other means of securing the second portion material 118b to the radiation shield walls 126 to help create the radiation shield 114. The zipper 120 can be used to secure or "zip" the first portion material 118a and the second portion material 118b together to create the lid of the radiation shield 114.

Figure 2B:
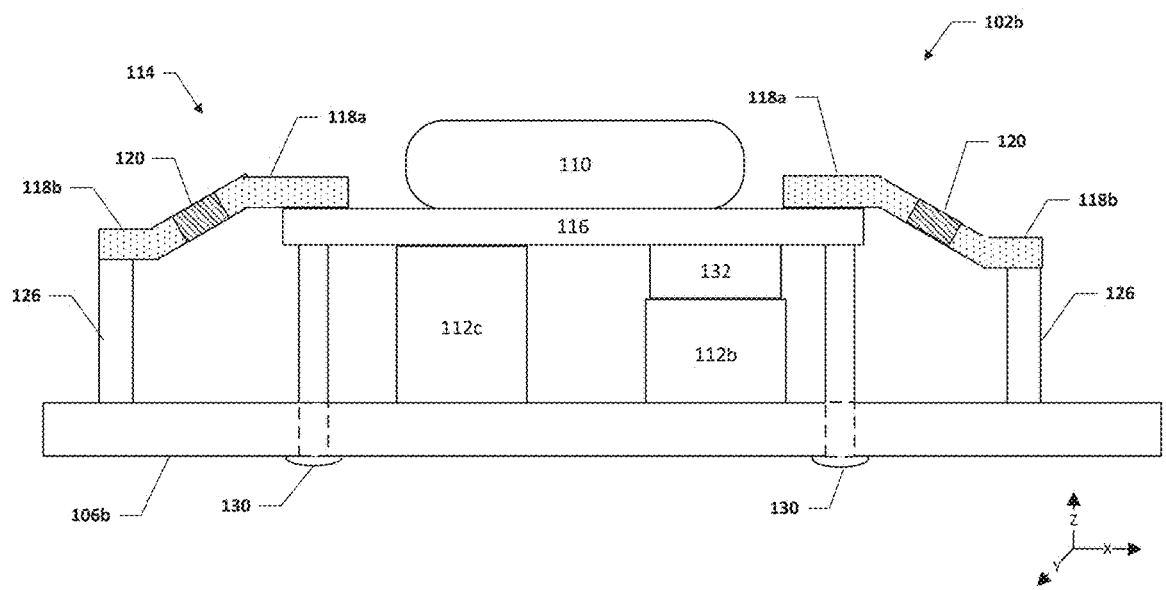
FIG. 2B is a simplified block diagram cut away side view of a portion of a system to enable a radiation shield with a zipper, in accordance with an embodiment of the present disclosure.

Turning to FIG. 2B, FIG. 2B is a simplified block diagram of a side cut away view of a portion of an electronic device 102b, in accordance with an embodiment of the present disclosure. In an example, the electronic device 102b can include the support structure 106b, the second radiation source 112b, a third radiation source 112c, the radiation shield 114, the cold plate 116, the heat pipe 110, and a thermal spacer 132. The radiation shield 114 can include the first portion material 118a, the second portion material 118b, the zipper 120, and the radiation shield walls 126. The cold plate 116 can be secured to the support structure 106b using one or more cold plate attachment mechanisms 130. The radiation shield walls 126 can extend from the support structure 106b.

The first portion material 118a can be coupled to a side of the cold plate 116 that is in thermal contact with the heat pipe 110. The first portion material 118a can be coupled to the cold plate 116 using adhesive, tape, fastener, (e.g., a bolt, rivet, screw, etc.), or some other means of securing the first portion material 118a to the cold plate 116 to help create the radiation shield 114. The second portion material 118b can be coupled to the radiation shield walls 126 using adhesive, tape, fastener, (e.g., a bolt, rivet, screw, etc.), or some other means of securing the second portion material 118b to the radiation shield walls 126 to help create the radiation shield 114. The zipper 120 can be used to secure or "zip" the first portion material 118a and the second portion material 118b together to create the lid of the radiation shield 114. As illustrated in FIG. 2B, the third radiation source 112c may have a height that is greater than the second radiation source 112b and the thermal spacer 132 can be used to fill the gap between the second radiation source 112b and the cold plate 116. The first portion material 118a and the second portion material 118b can be a flexible material that can accommodate the height different of the third radiation source 112c as compared to the first radiation source 112a illustrated in FIG. 2A without compromising the structural integrity of the radiation shield 114.

Figure 2C:
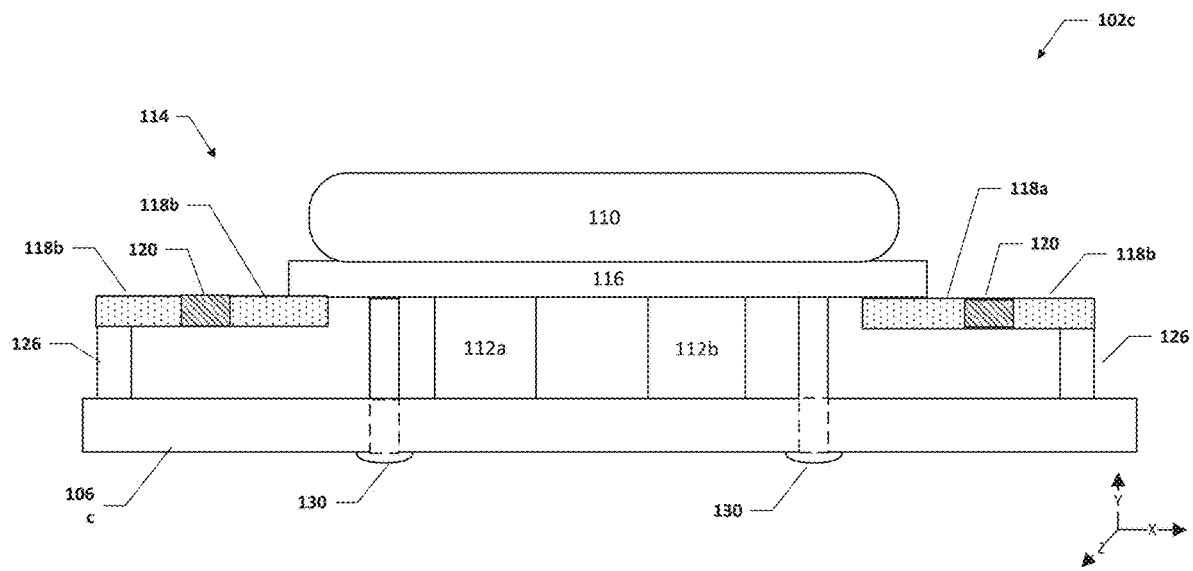
FIG. 2C is a simplified block diagram cut away side view of a portion of a system to enable a radiation shield with a zipper, in accordance with an embodiment of the present disclosure.

Turning to FIG. 2C, FIG. 2C is a simplified block diagram of a side cut away view of a portion of an electronic device 102c, in accordance with an embodiment of the present disclosure. In an example, the electronic device 102c can include the support structure 106c, the first radiation source 112a, the second radiation source 112b, the radiation shield 114, the cold plate 116, and the heat pipe 110. The radiation shield 114 can include the first portion material 118a, the second portion material 118b, the zipper 120, and the radiation shield walls 126. The cold plate 116 can be secured to the support structure 106c using one or more cold plate attachment mechanisms 130. The radiation shield walls 126 can extend from the support structure 106c.

As illustrated in FIG. 2C, the first portion material 118a can be coupled to a side of the cold plate 116 that is opposite the side that is in thermal contact with the heat pipe 110. In an example, the cold plate 116 may be relatively small, the heat pipe 110 may be relatively large, or there may be some other reason that the first portion material 118a cannot be coupled to the side of the cold plate 116 that is in thermal contact with the heat pipe 110.

The first portion material 118a can be coupled to the cold plate 116 using adhesive, tape, fastener, (e.g., a bolt, rivet, screw, etc.), or some other means of securing the first portion material 118a to the cold plate 116 to help create the radiation shield 114. The second portion material 118b can be coupled to the radiation shield walls 126 using adhesive, tape, fastener, (e.g., a bolt, rivet, screw, etc.), or some other means of securing the second portion material 118b to the radiation shield walls 126 to help create the radiation shield 114. The zipper 120 can be used to secure or "zip" the first portion material 118a and the second portion material 118b together to create the lid of the radiation shield 114.

Figure 3:
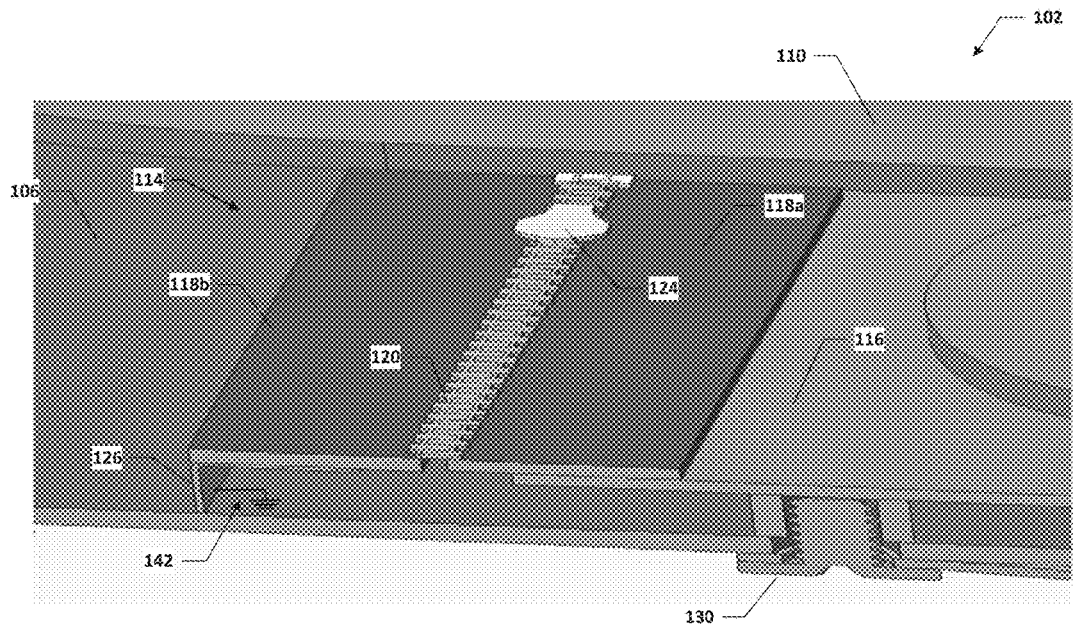
FIG. 3 is a simplified perspective view of a portion of a system to enable a radiation shield with a zipper, in accordance with an embodiment of the present disclosure.

Turning to FIG. 3, FIG. 3 is a simplified block diagram of a side cut away view of a portion of the electronic device 102, in accordance with an embodiment of the present disclosure. In an example, the electronic device 102 can include the support structure 106 and the heat pipe 110. The support structure 106 can include the radiation shield 114 and the cold plate 116. The cold plate 116 can be secured to the support structure 106 using one or more cold plate attachment mechanisms 130. The radiation shield 114 can include the first portion material 118a, the second portion material 118b, the zipper 120, and the radiation shield walls 126. The zipper 120 can include the zipper pull tab 124. The zipper pull tab 124 can be used to zip the zipper 120 to secure or "zip" the first portion material 118a and the second portion material 118b together to create the lid of the radiation shield 114 and to unzip the zipper 120 to separate or "unzip" the first portion material 118a and the second portion material 118b and allow access inside the radiation shield 114. The first portion material 118a and the second portion material 118b are an electrically conductive material and grounded through the walls of the radiation shield 114, where the walls are coupled to a ground plane 142 of the support structure 106. In other examples, the first portion material 118a and the second portion material 118b are grounded through the heat pipe 110 or the cold plate 116, or grounded through some other means.

Figure 4:
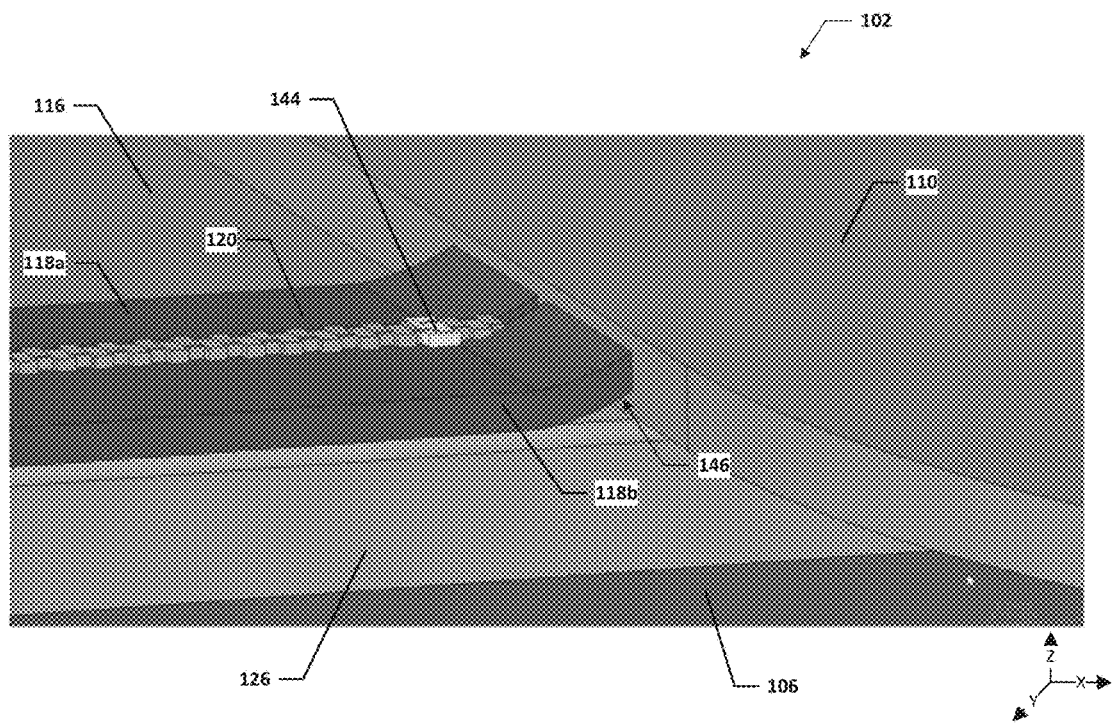
FIG. 4 is a simplified perspective view of a portion of a system to enable a radiation shield with a zipper, in accordance with an embodiment of the present disclosure.

Turning to FIG. 4, FIG. 4 is a simplified block diagram of a portion of the electronic device 102, in accordance with an embodiment of the present disclosure. In an example, the electronic device 102 can include the support structure 106 and the heat pipe 110. The support structure 106 can include the radiation shield 114 and the cold plate 116. The radiation shield 114 can include the first portion material 118a, the second portion material 118b, the zipper 120, and the radiation shield walls 126. The zipper 120 can include the zipper pull tab 124 (not shown) and a zipper pull stop 144. The zipper pull stop 144 helps to keep the zipper pull tab 124 from sliding off of the zipper 120. It should be noted that both ends of the zipper 120 have a zipper pull stop 144 but only one is shown in FIG. 4. In some examples, the location of the zipper pull stop 144 on the zipper 120 can create a gap that may compromise the effects of the radiation shield 114. To help close or seal off the gap, the first portion material 118a and the second portion material 118b can extend past the location of the zipper pull stop 144 and extend up or on a portion of the heat pipe 110 to create a gap block 146. In some examples, to help close or seal off the gap, tape or some other material may be used.

Figure 5:
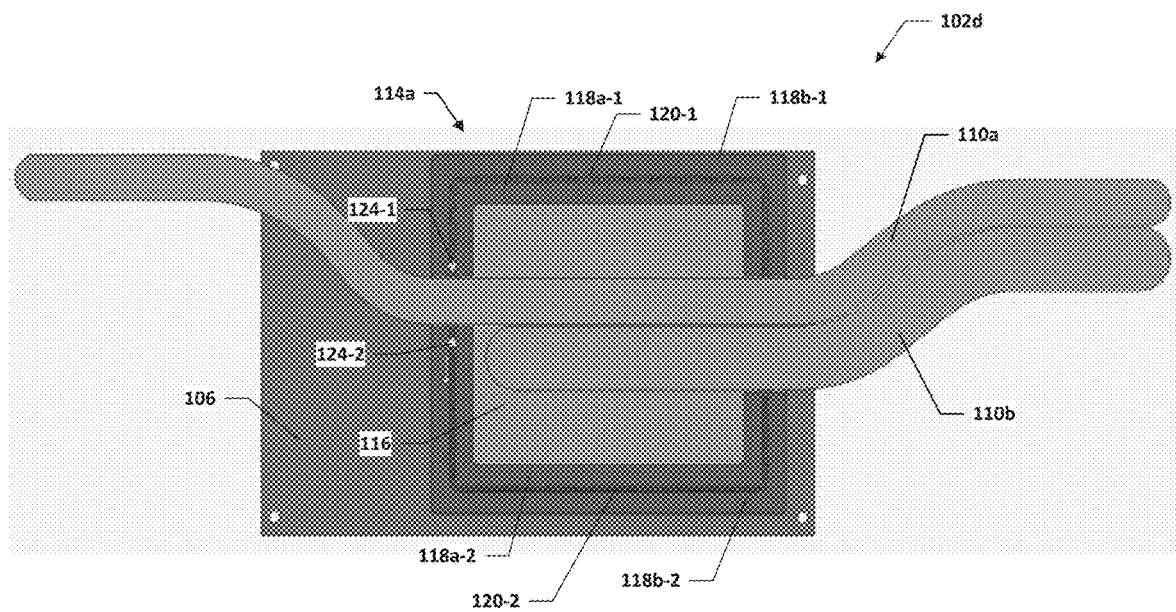
FIG. 5 is a simplified block diagram of a portion of a system to enable a radiation shield with a zipper, in accordance with an embodiment of the present disclosure.

Turning to FIG. 5, FIG. 5 is a simplified block diagram of a portion of an electronic device 102d, in accordance with an embodiment of the present disclosure. In an example, the electronic device 102d can include the support structure 106, a first heat pipe 110a, and a second heat pipe 110b. The support structure 106 can include a radiation shield 114a and the cold plate 116. The radiation shield 114a can include a first portion first side material 118a-1, a second portion first side material 118b-1, a first side zipper 120-1, a first portion second side material 118a-2, a second portion second side material 118b-2, and a second side zipper 120-2.

The first side zipper 120-1 can include a first side zipper pull tab 124-1. The first side zipper pull tab 124-1 can be used to zip the first side zipper 120-1 to secure or "zip" the first portion first side material 118a-1 and the second portion first side material 118b-1 together to create a portion of a lid of the radiation shield 114 and to unzip the first side zipper 120-1 to separate or "unzip" the first portion first side material 118a-1 and the second portion first side material 118b-1 and allow access to a portion of the inside the radiation shield 114.

The second side zipper 120-2 can include a second side zipper pull tab 124-2. The second side zipper pull tab 124-2 can be used to zip the second side zipper 120-2 to secure or "zip" the first portion second side material 118a-2 and the second portion second side material 118b-2 together to create a portion of the lid of the radiation shield 114 and to unzip the second side zipper 120-2 to separate or "unzip" the first portion second side material 118a-2 and the second portion second side material 118b-2 and allow access to a portion of the inside the radiation shield 114. It should be noted that more zippers can be added to accommodate additional heat pipes or other areas that may interfere with the zipper securing or "zipping" the first portion material 118a and the second portion material 118b to create a portion of the lid of the radiation shield 114 and the zipper separating or "unzipping" the first portion material 118a and the second portion material 118b to allow access inside the radiation shield 114.

Figure 6:
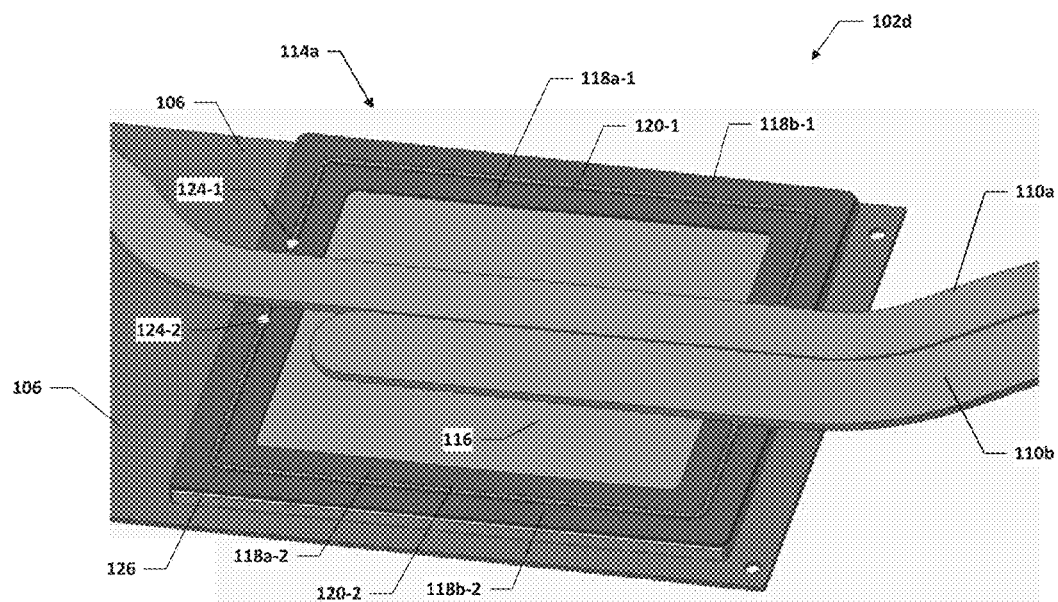
FIG. 6 is a simplified block diagram of a portion of a system to enable a radiation shield with a zipper, in accordance with an embodiment of the present disclosure.

Turning to FIG. 6, FIG. 6 is a simplified perspective block diagram of a portion of the electronic device 102d, in accordance with an embodiment of the present disclosure. In an example, the electronic device 102d can include the support structure 106, the first heat pipe 110a, and the second heat pipe 110b. The support structure 106 can include the radiation shield 114a and the cold plate 116. The radiation shield 114 can include the first portion first side material 118a-1, the second portion first side material 118b-1, the first side zipper 120-1, the first portion second side material 118a-2, the second portion second side material 118b-2, and the second side zipper 120-2.

The first side zipper 120-1 can include the first side zipper pull tab 124-1. The first side zipper pull tab 124-1 can be used to zip the first side zipper 120-1 to secure or "zip" the first portion first side material 118a-1 and the second portion first side material 118b-1 together to create a portion of the lid of the radiation shield 114 and to unzip the first side zipper 120-1 to separate or "unzip" the first portion first side material 118a-1 and the second portion first side material 118b-1 and allow access to a portion of the inside the radiation shield 114.

The second side zipper 120-2 can include the second side zipper pull tab 124-2. The second side zipper pull tab 124-2 can be used to zip the second side zipper 120-2 to secure or "zip" the first portion second side material 118a-2 and the second portion second side material 118b-2 together to create a portion of the lid of the radiation shield 114 and to unzip the second side zipper 120-2 to separate or "unzip" the first portion second side material 118a-2 and the second portion second side material 118b-2 and allow access to a portion of the inside the radiation shield 114.

Figure 7:
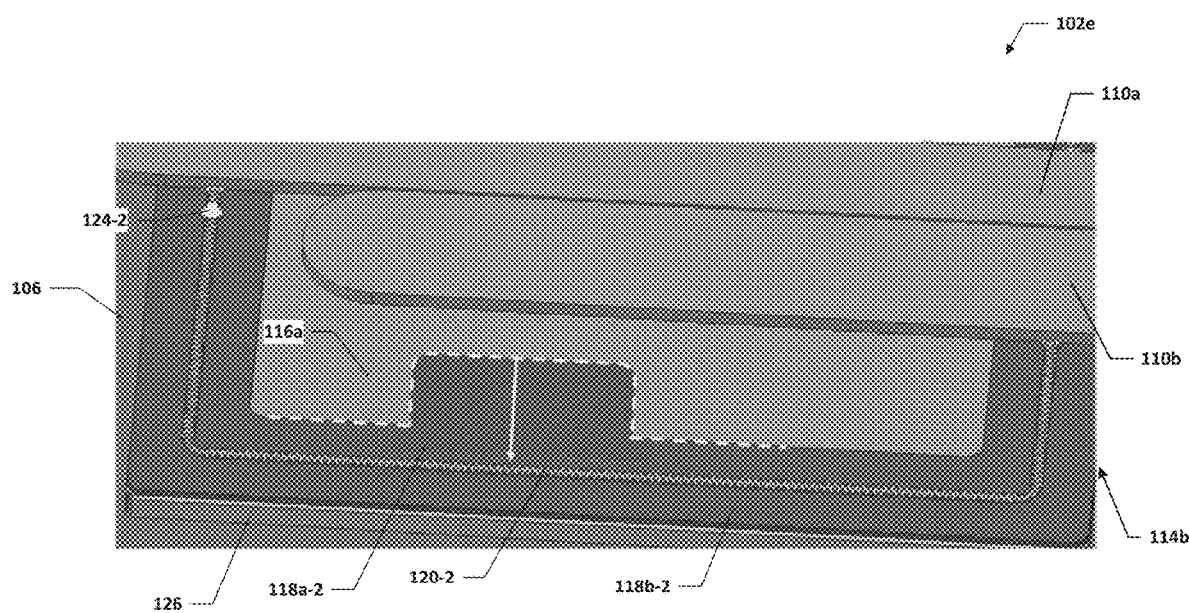
FIG. 7 is a simplified block diagram of a portion of a system to enable a radiation shield with a zipper, in accordance with an embodiment of the present disclosure.

Turning to FIG. 7, FIG. 7 is a simplified block diagram of a portion of an electronic device 102e, in accordance with an embodiment of the present disclosure. In an example, the electronic device 102e can include the support structure 106, the first heat pipe 110a, and the second heat pipe 110b. The support structure 106 can include the radiation shield 114b and the cold plate 116a. The radiation shield 114b can include the first portion first side material 118a-1 (not illustrated), the second portion first side material 118b-1 (not illustrated), the first side zipper 120-1 (not illustrated), the first portion second side material 118a-2, the second portion second side material 118b-2, and the second side zipper 120-2.

As illustrated in FIG. 7, the cold plate 116a may not have an even profile (e.g., not have one or more straight edges, not be a square or rectangle, etc.) and at least one side of the cold plate 116a may not be a straight line. The first portion second side material 118a-2 can accommodate the uneven profile by filling in gaps without comprising the integrity of the radiation shield 114. By filling in the gaps in the profile of the cold plate 116a with the first portion second side material 118a-2, the second side zipper pull tab 124-2 can be used to zip the second side zipper 120-2 to secure or "zip" the first portion second side material 118a-2 and the second portion second side material 118b-2 together to create a portion of the lid of the radiation shield 114 and to unzip the second side zipper 120-2 to separate or "unzip" the first portion second side material 118a-2 and the second portion second side material 118b-2 and allow access to a portion of the inside the radiation shield 114.

Figure 8:
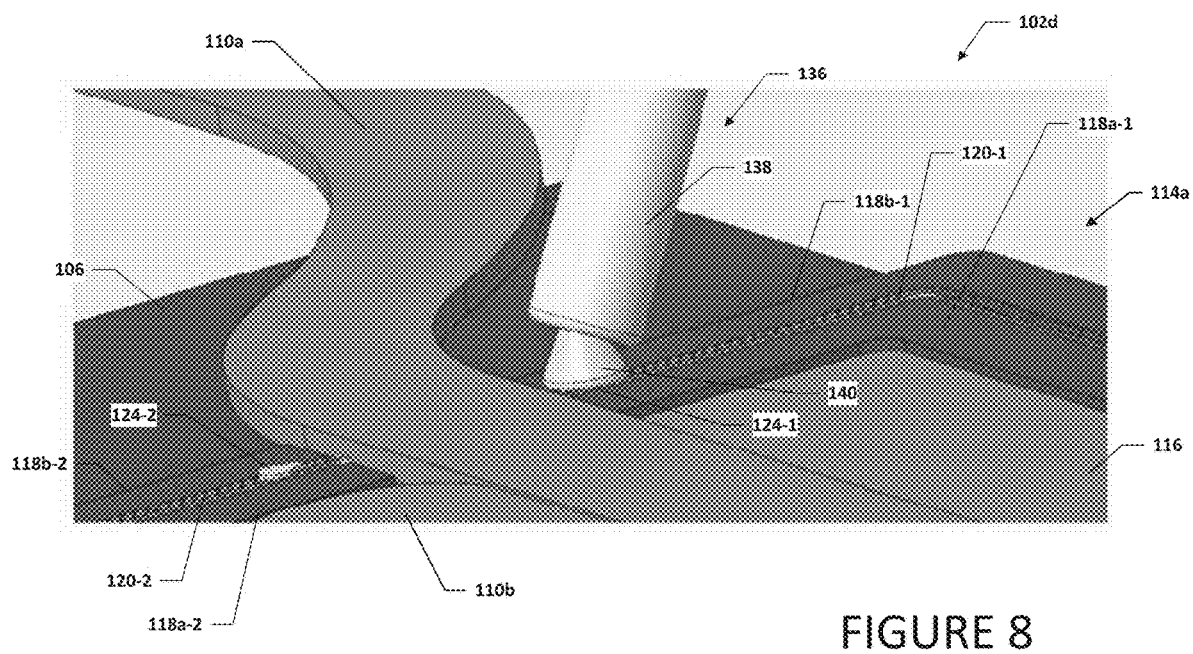
FIG. 8 is a simplified block diagram of a portion of a system to enable a radiation shield with a zipper, in accordance with an embodiment of the present disclosure.

Turning to FIG. 8, FIG. 8 is a simplified block diagram of a portion of the electronic device 102d, in accordance with an embodiment of the present disclosure. In an example, the electronic device 102d can include the support structure 106, the first heat pipe 110a, and the second heat pipe 110b. The support structure 106 can include the radiation shield 114a and the cold plate 116. The radiation shield 114 can include the first portion first side material 118a-1, the second portion first side material 118b-1, the first side zipper 120-1, the first portion second side material 118a-2, the second portion second side material 118b-2, and the second side zipper 120-2.

The first side zipper 120-1 can include the first side zipper pull tab 124-1. The first side zipper pull tab 124-1 can be used to zip the first side zipper 120-1 to secure or "zip" the first portion first side material 118a-1 and the second portion first side material 118b-1 together to create a portion of the lid of the radiation shield 114 and to unzip the first side zipper 120-1 to separate or "unzip" the first portion first side material 118a-1 and the second portion first side material 118b-1 and allow access to a portion of the inside the radiation shield 114. The second side zipper 120-2 can include the second side zipper pull tab 124-2. The second side zipper pull tab 124-2 can be used to zip the second side zipper 120-2 to secure or "zip" the first portion second side material 118a-2 and the second portion second side material 118b-2 together to create a portion of the lid of the radiation shield 114 and to unzip the second side zipper 120-2 to separate or "unzip" the first portion second side material 118a-2 and the second portion second side material 118b-2 and allow access to a portion of the inside the radiation shield 114.

In an example, a pull tab zipper mechanism 136 may be used by a user to help zip and unzip the first side zipper 120-1 and the second side zipper 120-2. The pull tab zipper mechanism 136 can include a main body 138 and a zipper pull tab coupling mechanism 140. The main body 138 can be held by the user (e.g., similar to a pen or stylus). The zipper pull tab coupling mechanism 140 can be configured to couple with the zipper pull tab 124. In a specific example, the zipper pull tab 124 and the zipper pull tab coupling mechanism 140 are magnetic and magnetically couple with each other.

Figure 9:
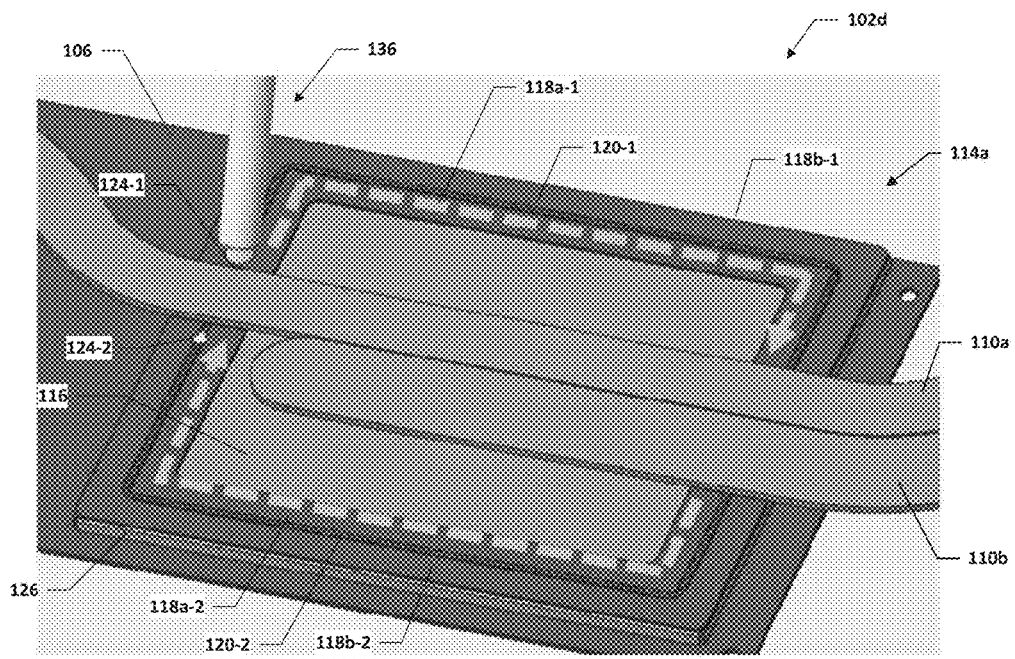
FIG. 9 is a simplified block diagram of a portion of a system to enable a radiation shield with a zipper, in accordance with an embodiment of the present disclosure.

Turning to FIG. 9, FIG. 9 is a simplified block diagram of a portion of the electronic device 102d, in accordance with an embodiment of the present disclosure. In an example, the electronic device 102d can include the support structure 106, the first heat pipe 110a, and the second heat pipe 110b. The support structure 106 can include the radiation shield 114a and the cold plate 116. The radiation shield 114 can include the first portion first side material 118a-1, the second portion first side material 118b-1, the first side zipper 120-1, the first portion second side material 118a-2, the second portion second side material 118b-2, and the second side zipper 120-2.

The first side zipper 120-1 can include the first side zipper pull tab 124-1. The first side zipper pull tab 124-1 can be used to zip the first side zipper 120-1 to secure or "zip" the first portion first side material 118a-1 and the second portion first side material 118b-1 together to create a portion of the lid of the radiation shield 114 and to unzip the first side zipper 120-1 to separate or "unzip" the first portion first side material 118a-1 and the second portion first side material 118b-1 and allow access to a portion of the inside the radiation shield 116. The second side zipper 120-2 can include the second side zipper pull tab 124-2. The second side zipper pull tab 124-2 can be used to zip the second side zipper 120-2 to secure or "zip" the first portion second side material 118a-2 and the second portion second side material 118b-2 together to create a portion of the lid of the radiation shield 114 and to unzip the second side zipper 120-2 to separate or "unzip" the first portion second side material 118a-2 and the second portion second side material 118b-2 and allow access to a portion of the inside the radiation shield 116. In an example, the pull tab zipper mechanism 136 may be used by a user to help zip and unzip the first side zipper 120-1 and the second side zipper 120-2. The pull tab zipper mechanism 136 can be held by the user (e.g., similar to a pen or stylus) to zip and unzip the first side zipper 120-1 and the second side zipper 120-2.

Figure 10:
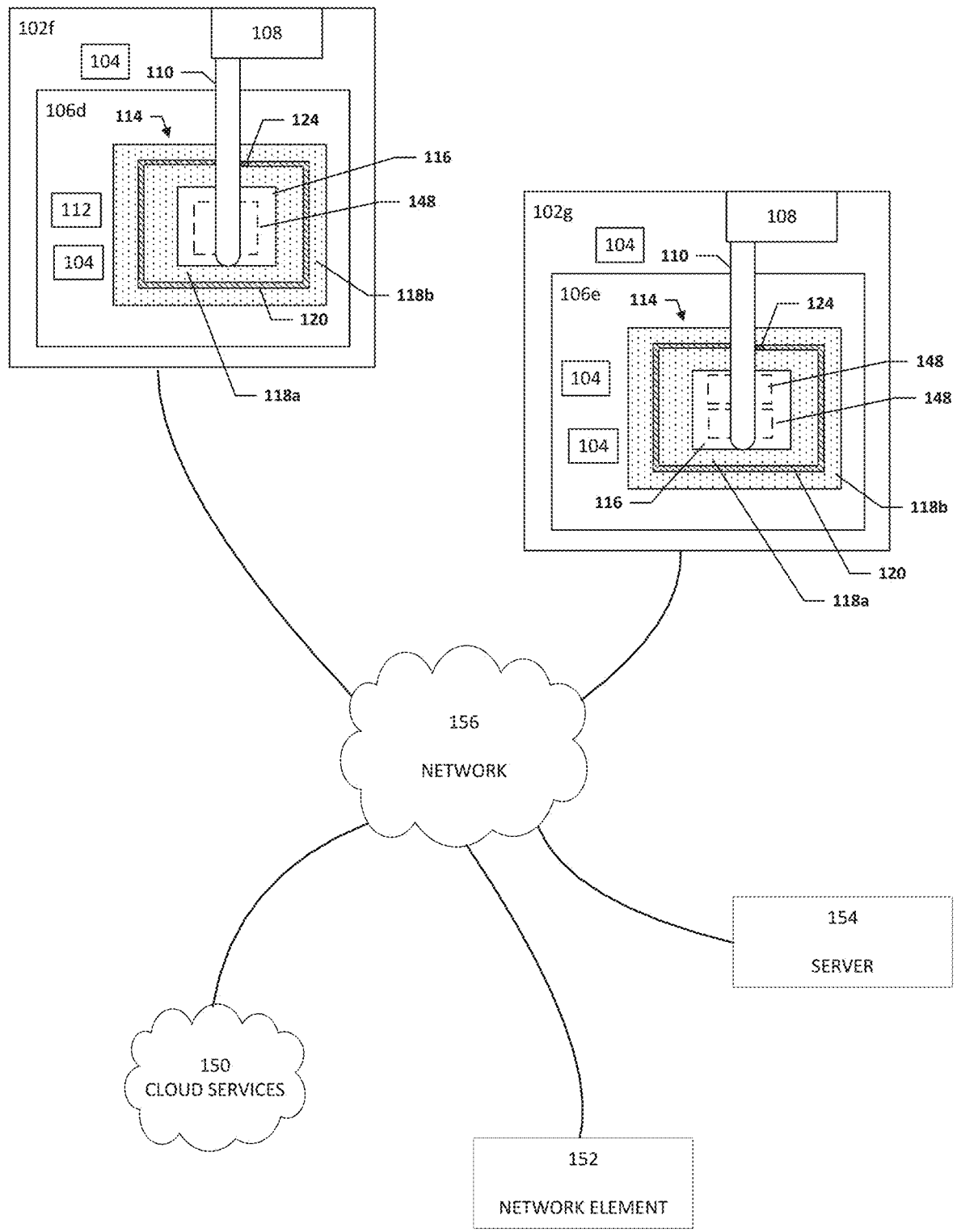
FIG. 10 is a block diagram illustrating example devices that include a radiation shield with a zipper, in accordance with an embodiment of the present disclosure.

Turning to FIG. 10, FIG. 10 is a simplified block diagram of electronic devices configured with a radiation shield with a zipper, in accordance with an embodiment of the present disclosure. For example, as illustrated in FIG. 10, an electronic device 102f can include the one or more electronics 104, a support structure 106d, the heatsink 108, and the heat pipe 110. The support structure 106d can include at least one of the one or more electronics 104, the one or more radiation sources 112, the radiation shield 114, and one or more radiation sensitive devices 148. The radiation shield 114 can be over the one or more radiation sensitive devices 148 to help shield the one or more radiation sensitive devices 148 from the radiation from the one or more radiation sources 112 or mitigate the effects of the radiation from the one or more radiation sources 112 from effecting the one or more radiation sensitive devices 148 or at least partially mitigate the effects of the radiation from the one or more radiation sources 112 on the one or more radiation sensitive devices 148.

Also, an electronic device 102g can include the one or more electronics 104, a support structure 106e, the heatsink 108, and the heat pipe 110. The support structure 106e can include at least one of the one or more electronics 104, the radiation shield 114, and one or more radiation sensitive devices 148. The radiation shield 114 can be over the one or more radiation sensitive devices 148 to help shield the one or more radiation sensitive devices 148 from the radiation from outside of the electronic device 102g or mitigate the effects of the radiation from outside of the electronic device 102g from effecting the one or more radiation sensitive devices 148 or at least partially mitigate the effects of the radiation from outside of the electronic device 102g on the one or more radiation sensitive devices 148.

Each of the electronic devices 102f and 102g (and 102a-120e) may be in communication with each other, cloud services 150, network element 152, and/or server 154 using network 156. In some examples, the one or more of electronic devices 102f and 102g (and 102a-120e) may be standalone devices and not connected to the network 156 or another device.

Elements of FIG. 10 may be coupled to one another through one or more interfaces employing any suitable connections (wired or wireless), which provide viable pathways for network (e.g., the network 156, etc.) communications. Additionally, any one or more of these elements of FIG. 10 may be combined or removed from the architecture based on particular configuration needs. The network 156 may include a configuration capable of transmission control protocol/Internet protocol (TCP/IP) communications for the transmission or reception of packets in a network. Each of the electronic devices 102f and 102g (and 102a-120e) may also operate in conjunction with a user datagram protocol/IP (UDP/IP) or any other suitable protocol where appropriate and based on particular needs.

Turning to the network infrastructure of FIG. 10, the network 156 represents a series of points or nodes of interconnected communication paths for receiving and transmitting packets of information. The network 156 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In the network 156, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, the electronic devices 102a-102g are meant to encompass a computer, a personal digital assistant (PDA), a laptop or electronic notebook, a cellular telephone, a smartphone, an IP phone, network elements, network appliances, servers, routers, switches, gateways, bridges, load balancers, processors, modules, or any other device, component, element, or object that includes a radiation source and/or a radiation sensitive device. Each of the electronic devices 102a-102g may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102a-102g may include virtual elements.

In regards to the internal structure, each of the electronic devices 102a-102g can include memory elements for storing information to be used in operations. Each of the electronic devices 102a-102g may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations. This includes the memory elements being able to store software, logic, code, or processor instructions that are executed to carry out operations or activities.

Additionally, each of the electronic devices 102a-102g can include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Implementations of the embodiments disclosed herein may be formed or carried out on or over a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

Note that with the examples provided herein, interaction may be described in terms of one, two, three, or more elements. However, this has been done for purposes of clarity and example only. In certain cases, it may be easier to describe one or more of the functionalities by only referencing a limited number of elements. It should be appreciated that the electronic devices 102a-102g and their teachings are readily scalable and can accommodate a large number of components, as well as more complicated/sophisticated arrangements and configurations. Accordingly, the examples provided should not limit the scope or inhibit the broad teachings of the electronic devices 102a-102g and as potentially applied to a myriad of other architectures.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although the electronic devices 102a-102g have been illustrated with reference to particular elements and operations, these elements and operations may be replaced by any suitable architecture, protocols, and/or processes that achieve the intended functionality of the electronic devices 102a-102g.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, is a radiation shield including a wall that extends from a support structure, a first portion that is coupled to a cold plate, a second portion that is coupled to the wall, and a zipper that can zip the first portion to the second portion and can unzip the first portion from the second portion.

In Example A2, the subject matter of Example A1 can optionally include where the first portion and the second portion include a flexible conductive material.

In Example A3, the subject matter of any one of Examples A1-A2 can optionally include where the wall is grounded to a ground plane in the support structure.

In Example A4, the subject matter of any one of Examples A1-A3 can optionally include where the support structure is a printed circuit board.

In Example A5, the subject matter of any one of Examples A1-A4 can optionally include where the radiation shield houses a radiation source that emits electromagnetic interference (EMI) and/or radio-frequency interference (RFI).

In Example A6, the subject matter of any one of Examples A1-A5 can optionally include where the radiation shield houses a radiation sensitive device that is affected by electromagnetic interference (EMI) and/or radio-frequency interference (RFI).

Example AA1 is an electronic device including a support structure, a radiation source on the support structure, a cold plate over the radiation source, and a radiation shield around the radiation source. The radiation shield includes a first portion coupled to the cold plate, a second portion, and a zipper that can zip and unzip the first portion and the second portion.

In Example AA2, the subject matter of Example AA1 can optionally include where the radiation shield further includes a wall secured to the support structure, where the second portion is coupled to the wall of the radiation shield.

In Example AA3, the subject matter of any one of Examples AA1-AA2 can optionally include where the wall is grounded to a ground plane in the support structure.

In Example AA4, the subject matter of any one of Examples AA1-AA3 can optionally include where the first portion and the second portion include a flexible conductive material.

In Example AA5, the subject matter of any one of Examples AA1-AA4 can optionally include a heat pipe that extends from the cold plate to a heat sink, where the zipper extends from one side of the heat pipe to an opposite second side of the heat pipe.

In Example AA6, the subject matter of any one of Examples AA1-AA5 can optionally include where at least one edge of the cold plate is not a straight line.

In Example AA7, the subject matter of any one of Examples AA1-AA6 can optionally include where the support structure is a printed circuit board Example M1 is a method including identifying a radiation source on a support structure, adding a cold plate over the radiation source, and creating a radiation shield to mitigate radiation effects from the radiation source, where the radiation shield includes a wall that is secured to a surface of the support structure, a first portion that is coupled to the cold plate, a second portion that is coupled to the wall, and a zipper.

In Example M2, the subject matter of Example M1 can optionally include zipping the first portion to the second portion to create a lid of the radiation shield.

In Example M3, the subject matter of any one of the Examples M1-M2 can optionally include unzipping the first portion from the second portion to separate the first portion from the second portion.

In Example M4, the subject matter of any one of the Examples M1-M3 can optionally include where the wall is grounded to a ground plane in the support structure.

In Example M5, the subject matter of any one of the Examples M1-M4 can optionally include where the first portion and the second portion include a flexible conductive material.

In Example M6, the subject matter of any one of the Examples M1-M5 can optionally include where the radiation shield mitigates effects of at least a portion of electromagnetic interference (EMI) and/or radio-frequency interference (RFI) emitted from the radiation source.

n Example M7, the subject matter of any one of the Examples M1-M6 can optionally include where the support structure is a printed circuit board.

What is claimed is:

1. A radiation shield comprising:
   a wall that extends from a support structure;
   a first portion that is coupled to a cold plate;
   a second portion that is coupled to the wall; and
   a zipper that can zip the first portion to the second portion and can unzip the first portion from the second portion.

2. The radiation shield of claim 1, wherein the first portion and the second portion include a flexible conductive material.

3. The radiation shield of claim 1, wherein the wall is grounded to a ground plane in the support structure.

4. The radiation shield of claim 1, wherein the support structure is a printed circuit board.

5. The radiation shield of claim 1, wherein the radiation shield houses a radiation source that emits electromagnetic interference (EMI) and/or radio-frequency interference (RFI).

6. The radiation shield of claim 1, wherein the radiation shield houses a radiation sensitive device that is affected by electromagnetic interference (EMI) and/or radio-frequency interference (RFI).

7. An electronic device comprising:
   a support structure;
   a radiation source on the support structure;
   a cold plate over the radiation source; and
   a radiation shield around the radiation source, wherein the radiation shield includes:
   a first portion coupled to the cold plate;
   a second portion; and
   a zipper that can zip and unzip the first portion and the second portion.

8. The electronic device of claim 7, wherein the radiation shield further includes:
   a wall secured to the support structure, wherein the second portion is coupled to the wall of the radiation shield.

9. The electronic device of claim 8, wherein the wall is grounded to a ground plane in the support structure.

10. The electronic device of claim 7, wherein the first portion and the second portion include a flexible conductive material.

11. The electronic device of claim 7, further comprising:
    a heat pipe that extends from the cold plate to a heat sink, wherein the zipper extends from one side of the heat pipe to an opposite second side of the heat pipe.

12. The electronic device of claim 7, wherein at least one edge of the cold plate is not a straight line.

13. The electronic device of claim 7, wherein the support structure is a printed circuit board.

14. A method comprising:
    identifying a radiation source on a support structure;
    adding a cold plate over the radiation source; and
    creating a radiation shield to mitigate radiation effects from the radiation source, wherein the radiation shield includes:
    a wall that is secured to a surface of the support structure;
    a first portion that is coupled to the cold plate;
    a second portion that is coupled to the wall; and
    a zipper.

15. The method of claim 14, further comprising:
    zipping the first portion to the second portion to create a lid of the radiation shield.

16. The method of claim 14, further comprising:
    unzipping the first portion from the second portion to separate the first portion from the second portion.

17. The method of claim 14, wherein the wall is grounded to a ground plane in the support structure.

18. The method of claim 14, wherein the first portion and the second portion include a flexible conductive material.

19. The method of claim 14, wherein the radiation shield mitigates effects of at least a portion of electromagnetic interference (EMI) and/or radio-frequency interference (RFI) emitted from the radiation source.

20. The method of claim 14, wherein the support structure is a printed circuit board.

* * * * *